(12) United States Patent
Uenishi

(10) Patent No.: US 6,781,206 B2
(45) Date of Patent: Aug. 24, 2004

(54) SEMICONDUCTOR DEVICE WITH STRUCTURE RESTRICTING FLOW OF UNNECESSARY CURRENT THEREIN

(75) Inventor: Akio Uenishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/208,983

(22) Filed: Aug. 1, 2002

(65) Prior Publication Data

US 2003/0160287 A1 Aug. 28, 2003

(30) Foreign Application Priority Data

Feb. 25, 2002 (JP) ........................................ 2002-047409

(51) Int. Cl.[7] .............................................. H01L 29/76
(52) U.S. Cl. ...................... 257/373; 257/288; 257/368; 438/197; 438/208; 438/220
(58) Field of Search ................................ 257/288, 368, 257/373; 438/197, 208, 220

(56) References Cited

U.S. PATENT DOCUMENTS 4,929,884 A * 5/1990 Bird et al. ................... 323/313

OTHER PUBLICATIONS

O. Gonnard et al., "Multi-ring Active Analogic Protection for Minority Carrier Injection Suppression in Smart Power Technology", ISPSD 2001, pp. 351-354.

* cited by examiner

*Primary Examiner*—Nathan J. Flynn
*Assistant Examiner*—Scott R. Wilson
(74) *Attorney, Agent, or Firm*—McDermott, Will & Emery

(57) ABSTRACT

Isolation regions, a peripheral anode, an N-type island region for output and a passive N-type island region are formed at the main surface of a P⁻ substrate. A dummy N-type island region is formed at a region located between two isolation regions. A P-type region is formed at the surface of this N well. A pair of N$^{++}$ type regions are formed at the surface of P-type region. A gate electrode is formed on a portion of P-type region interposed between N$^{++}$ type regions. N$^{++}$ type region is connected to ground while N$^{++}$ type region is electrically connected to isolation region. Accordingly, current is restricted from flowing between the N-type island region for output and the passive N-type island region so as to obtain a semiconductor device in which occurrence of malfunctions is prevented.

16 Claims, 15 Drawing Sheets

SEMICONDUCTOR DEVICE WITH STRUCTURE RESTRICTING FLOW OF UNNECESSARY CURRENT THEREIN

BACKGROUND OF THE INVENTION

1. Field of the Invention

The present invention relates to a semiconductor device, and more particularly to a semiconductor device provided with a diode.

2. Description of the Background Art

A substrate diode for controlling current is applied in a bridge output stage of a junction isolation type IC (Integrated Circuit) for controlling a motor. A conventional semiconductor device provided with such a substrate diode is described as follows.

An N-type island region for output, in which an output transistor is formed and to which a load, such as a motor, is connected, is formed at a P⁻ substrate as described above in an application wherein a load current is allowed to freewheel. This N-type island region for output is biased to a negative voltage at the time of freewheel operation and, thereby, the junction between the N-type island region for output and the P⁻ substrate becomes of a forward bias condition so that electrons are injected from the N-type island region for output to the P⁻ substrate.

Electrons are injected into the P⁻ substrate and, thereby, a parasitic NPN transistor existing between a passive N-type island region, formed at the P⁻ substrate and forming a portion of another control circuit, and the N-type island region for output starts to operate.

Therefore, in addition to a current that becomes the main current flowing from the N-type island region for output toward a peripheral anode region formed at the P⁻ substrate, an unnecessary current flows from the N-type island region for output to the passive N-type island region. As a result, the semiconductor device in some cases causes a malfunction.

Concerning such a malfunction, a technique for suppressing such an unnecessary current is reported in, for example, the reference, (O. Gonnard et al., "Multi-ring Active Analogic Protection for Minority Carrier Injection Suppression in Smart Power Technology", ISPSD2001, pp. 351–354).

That is to say, a technique wherein a predetermined P-type isolation region and a dummy N-type island region are provided in a region of the P⁻ substrate located between the N-type island region for output and the passive N-type island region and this P-type isolation region and the dummy N-type island region are short circuited by an aluminum wire is considered effective for suppressing the unnecessary current.

Here, a semiconductor device wherein this technique is adopted is concretely described. As shown in FIG. 10, a peripheral anode 104a, an N-type island region 107a for output and passive N-type island region 107b, respectively, are formed at a distance from each other in one of the main surfaces of a P⁻ substrate 101.

A load 114, such as a motor, is connected to N-type island region 107a for output. A substrate diode is formed of P⁻ substrate 101 and N-type island region 107a for output. Passive N-type island region 107b becomes a portion of another control circuit formed at P⁻ substrate 101, for example, a collector of an NPN transistor.

Here, N-type island region 107a for output is formed of a buried N⁺ floating collector region 105a and an N well 106a while passive N-type island region 107b is formed of a buried N⁺ floating collector region 105b and an N well 106b.

In addition, isolation regions 104b and 104c connected to P⁻ substrate 101 are formed at a region of P⁻ substrate 101 located between N-type island region 107a for output and passive N-type island region 107b.

Furthermore, a similar isolation region 104a is formed at a region of P⁻ substrate 101 on the side of N-type island region 107a for output opposite to the side wherein passive N-type island region 107b is located. This isolation region 104a forms a peripheral anode. Here, isolation regions 104a, 104b and 104c, respectively, are formed of P⁺ regions 102a to 102c and P wells 103a to 103c.

On the other hand, a P substrate anode 115 is formed at the other main surface of P⁻ substrate 101. A load current (main current) flows through isolation region (peripheral anode) 104a and P substrate anode 115 at the time of freewheel operation.

N⁻ epitaxial regions 108, of which the impurity concentration is comparatively low, are formed at a region located between N-type island region 107a for output and isolation region 104c, at a region located between passive N-type island region 107b and isolation region 104b, and the like, in order to attain a necessary withstand voltage.

In the semiconductor device shown in FIG. 10, two isolation regions 104b and 104c are provided at a region between N-type island region 107a for output and passive N-type island region 107b and, furthermore, a dummy N-type island region 107c is formed at a region located between these two isolation regions 104b and 104c. Dummy N-type island region 107c is formed of a buried N⁺ floating collector region 105c and an N well 106c.

Dummy N-type island region 107c and isolation region 104b, which is located on the side of this dummy N-type island region 107c on which passive N-type island region 107b is located, are electrically short circuited via an aluminum wire 112.

In the above described semiconductor device, electrons are injected from N-type island region 107a for output toward P⁻ substrate 101 under the condition wherein the voltage of N-type island region 107a for output is negative (negative bias) so that electrons are stored in P⁻ substrate 101.

The stored electrons tend to diffuse toward passive N-type island region 107b. At this time, dummy N-type island region 107c is electrically short circuited to isolation region 104b, which is electrically connected to P⁻ substrate 101, and, thereby, the voltage of dummy N-type island region 107c becomes higher than the voltage of isolation region 104b. That is to say, the potential of dummy N-type island region 107c becomes higher than the potential of isolation region 104b.

Thereby, the stored electrons are captured by dummy N-type island region 107c so that the tendency of the electrons to diffuse toward passive N-type island region 107b is restricted.

As a result, little current flows from passive N-type island region 107b toward N-type island region 107a for output and the main current flows as shown by solid line 200 from the peripheral anode (isolation region 104b) toward N-type island region 107a for output.

Thus, in the conventional semiconductor device, the tendency of the current to flow from passive N-type island region 107b toward N-type island region 107a for output is restricted so that malfunctions that accompany the current are prevented in the condition wherein the voltage of N-type island region 107a for output is negative.

However, the following problem arises in the conventional semiconductor device. The results of device simulations carried out on the structure of the semiconductor device shown in FIG. 10 are shown in FIGS. 11 and 12, respectively. FIG. 11 shows the waveform of current Ie that flows through N-type island region 107a for output and the waveform of current Ic that flows through passive N-type island region 107b, respectively, in the case that voltage Ve of N-type island region 107a for output is switched to positive, to negative and to positive in sequence over a period of time, as shown in FIG. 12.

FIG. 12 shows the waveform of voltage Ve that is applied to N-type island region 107a for output, the waveform of voltage Vsal of aluminum wire 112 and the waveform of voltage Vb of the peripheral anode (isolation region 104a), respectively.

Here, in this device simulation, an external resistor corresponding to load 114 is added between N-type island region 107a for output and the bias power supply while an external register corresponding to a wire resistor, or the like, is added between the peripheral anode and ground. In addition, a resin die bonding type is posited as the semiconductor device so that P substrate anode 115 is set at the open condition.

As shown in FIG. 12, voltage Ve of N-type island region 107a for output is in the negative condition (negative bias) in a range of time of from 0.5 µs to 1.0 µs. This condition is the condition wherein freewheel operation is carried out and is the condition wherein the load current flows from the peripheral anode (isolation region 104a) toward N-type island region 107a for output.

At this time, the electrons injected from N-type island region 107a for output toward P⁻ substrate 101 so as to stored are captured by dummy N-type island region 107c having a potential higher than that of isolation region 104b, as described above. Thereby, it is seen, as shown in FIG. 11, that little current Ic flows through passive N-type island region 107b.

Thus, it is seen from the result of the device simulation that the technique of electrically short circuiting dummy N-type island region 107c to isolation region 104b, which is electrically connected to P⁻ substrate 101 via aluminum wire 112, is an effective means for the suppression of current in the condition wherein the voltage of N-type island region 107a for output is negative.

As shown in FIG. 11, however, it is seen that a comparatively large current Ic temporarily flows through passive N-type island region 107b immediately after the voltage of N-type island region 107a for output is switched from the negative condition to the positive condition at a time after 1.0 µs has elapsed. That is to say, current Ic flows when the substrate diode formed of P⁻ substrate 101, including isolation region 104a, and of N-type island region 107a for output performs reverse recovery (reverse recovery period).

The device simulation results of voltage (potential) and current distributions within the semiconductor device at this time are shown in FIGS. 13 and 14. In particular, FIG. 13 shows the condition at time 1.03 µs while FIG. 14 shows the condition at time 1.05 µs.

As shown in FIGS. 13 and 14, the voltage of P⁻ substrate 101 transitionally rises so that the junction between passive N-type island region 107b and P⁻ substrate 101 becomes of a forward bias condition and electrons shift toward N-type island region 107a for output before the electrons stored in a region of P⁻ substrate 101 in the vicinity of passive N-type island region 107b are swept out so as to be eliminated. As a result, current Ic flows from N-type island region 107a for output toward passive N-type island region 107b through P⁻ substrate 101.

That is to say, immediately after the voltage of N-type island region 107a for output is switched from negative to positive, as shown in FIG. 15, current Ic temporarily flows from N-type island region 107a for output toward passive N-type island region 107b in addition to the flow of main current Ib that flows from N-type island region 107a for output to the peripheral anode (isolation region 104a) through P⁻ substrate 101.

Furthermore, as shown in FIG. 11, it is seen that a comparatively large current Ic temporarily flows through passive N-type island region 107b in the vicinity of time 0.0 µs. This is a case wherein the voltage of N-type island region 107a for output is switched from the condition of 0 to positive.

In this case, the voltage of P⁻ substrate 101 transitionally rises via the junction capacitor between N-type island region 107a for output and P⁻ substrate 101 due to a rapid rise in the voltage of N-type island region 107a for output. As a result, the junction between passive N-type island region 107b and P⁻ substrate 101 becomes of the forward bias condition so that current Ic temporarily flows from N-type island region 107a for output toward passive N-type island region 107b.

That is to say, immediately after that, the voltage of N-type island region 107a for output is switched from 0 to positive, as shown in FIG. 16, current Ic temporarily flows from N-type island region 107a for output toward passive N-type island region 107b in addition to the flow of main current Ib that flows from N-type island region 107a for output to the peripheral anode (isolation region 104a) through P⁻ substrate 101.

Here, this case is different from the above described case immediately after the voltage of N-type island region 107a for output is switched from negative to positive and the voltage of N-type island region 107a for output is switched from 0 to positive and, therefore, few electrons are stored in P⁻ substrate 101.

Therefore, as shown in FIG. 17, the magnitude of current Ic (portion A in FIG. 17) that flows from N-type island region 107a for output toward passive N-type island region 107b and the period of time during which current Ic flows are, both, less than those of the case of current Ic (portion B in FIG. 17) that flows immediately after the voltage of N-type island region 107a for output is switched from negative to positive.

Here, though in addition to the above described semiconductor device, the configuration wherein isolation regions 104b and 104c as well as dummy N-type island region 107c, respectively, are connected to ground voltage has also been proposed, in this case the rise in voltage of P⁻ substrate 101 is restricted and, thereby, the effect of the reduction of current Ic that accompanies a rapid rise of the voltage of N-type island region 107a for output is recognized.

At the time of freewheel operation, however, isolation regions 104b and 104c, which are connected to ground voltage, operate as the anode together with the peripheral anode 104a so that current flows through isolation regions 104b and 104c. Therefore, the density of electrons increases in a portion of a region of P⁻ substrate 101 located in the vicinity of passive N-type island region 107b.

As a result, there is a problem wherein a parasitic NPN transistor cannot be sufficiently restricted from operating between passive N-type island region 107b and N-type island region 107a for output.

As described above, in the conventional semiconductor device, immediately after the voltage of N-type island region 107a for output is switched from negative to positive, and immediately after the voltage of N-type island region 107a for output is switched from 0 to positive, a current flows between N-type island region 107a for output and passive N-type island region 107b so that there is a problem wherein this current invites a malfunction of the semiconductor device.

SUMMARY OF THE INVENTION

The present invention is provided to solve the above described problems and a purpose thereof is to provide a semiconductor device wherein a current is restricted from flowing between an N-type island region and a passive N-type island region immediately after the voltage of the N-type island region for output is switched from negative to positive and immediately after the voltage of the N-type island region for output is switched from 0 to positive so that occurrence of malfunctions is prevented.

A semiconductor device according to the present invention is provided with a first impurity region of a second conductive type, a second impurity region of the second conductive type, a third impurity region of a first conductive type, a fourth impurity region of the second conductive type, a fifth impurity region of the first conductive type, a pair of sixth impurity regions of the second conductive type, a seventh impurity region of the first conductive type and an electrode part. The first impurity region of the second conductive type is formed at the main surface of a semiconductor substrate of the first conductive type. The second impurity region of the second conductive type is formed at the main surface of the semiconductor substrate at a distance from the first impurity region. The third impurity region of the first conductive type is formed at the surface of a region of the semiconductor substrate located between the first impurity region and the second impurity region. The fourth impurity region of the second conductive type is formed at the surface of a region of the semiconductor substrate located between the first impurity region and the third impurity region. The fifth impurity region of the first conductive type is formed at the surface of the fourth impurity region. The pair of sixth impurity regions of the second conductive type is formed at a distance from each other in the surface of the fifth impurity region. The seventh impurity region of the first conductive type is formed at the surface of a region portion of the semiconductor substrate located on the side of the first impurity region opposite to the side on which the fourth impurity region is located. The electrode part is formed on a region portion of the fifth impurity region located between the pair of sixth impurity regions. One region of the pair of sixth impurity regions and the third impurity region are electrically connected to each other. The other region of the pair of sixth impurity regions is grounded.

According to this structure, the voltage of the semiconductor substrate transitionally rises so that the junction between the second impurity region (passive N-type island region) and the semiconductor substrate tends to become of a forward bias condition immediately after the voltage of the first impurity region (N-type island region for output) is switched from the 0 condition to the positive condition and immediately after the voltage of the first impurity region is switched from the negative condition to the positive condition. On the other hand, a voltage of a predetermined threshold voltage, or higher, is applied to the electrode part when the voltage of the first impurity region is positive so that a switching element (MOSFET) formed of the fifth impurity region, the sixth impurity region and the electrode part becomes of the ON condition. Therefore, the main current flows from the first impurity region to the seventh impurity region (isolation region) through the semiconductor substrate and, at the same time, current Ids flows from the first impurity region to be bypassed to ground through the semiconductor substrate, the third impurity region (isolation region) and the pair of sixth impurity regions ($N^{++}$ regions). Thereby, in this semiconductor device, a major portion of current Ic, which flows from the first impurity region toward the second impurity region in the conventional semiconductor device, is bypassed to ground as current Ids that flows through the sixth impurity region. As a result, current Ic that flows from the first impurity region toward the second impurity region is greatly reduced both immediately after the voltage of the first impurity region is switched from 0 to positive and immediately after the voltage of the first impurity region is switched from negative to positive so that malfunctions of the semiconductor device can be prevented.

In addition, it is preferable for the third impurity region and the fourth impurity region to be, further, electrically connected to each other.

Thereby, the effect of restriction of a leak current due to diffusion of electrons into the second impurity region in a condition wherein the voltage of the first impurity region is negative can also be obtained in the same manner as in the prior art.

Furthermore, it is preferable for the electrode part and the first impurity region to be electrically connected to each other.

In this case, the switching element can be turned to the ON condition without fail according to the timing of a positive voltage that is applied to the first impurity region.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
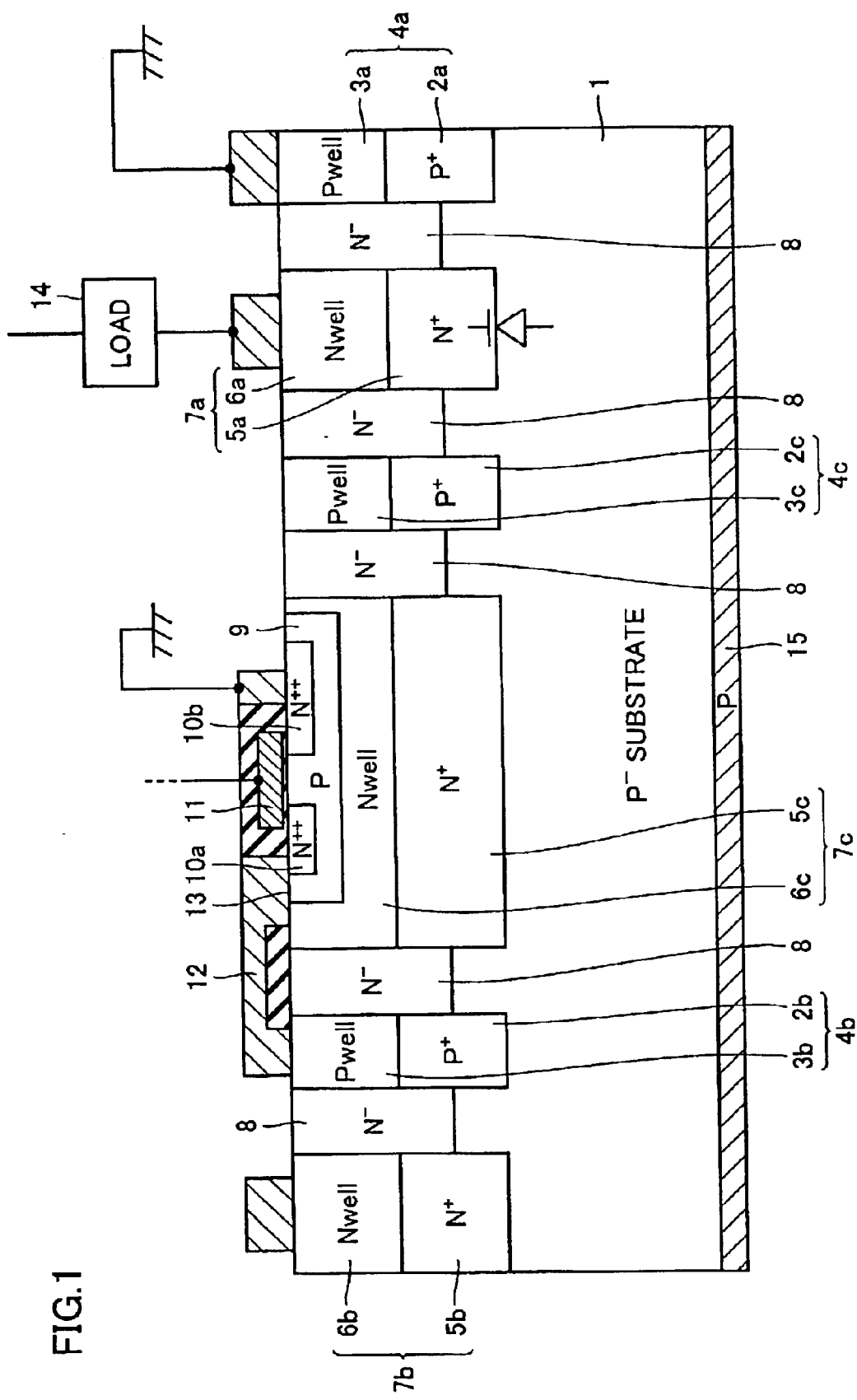
FIG. 1 is a cross sectional view of a semiconductor device according to an embodiment of the present invention.

A semiconductor device according to an embodiment of the present invention is described. As shown in FIG. 1, a peripheral anode 4a, an N-type island region 7a for output and a passive N-type island region 7b, respectively, are formed at a distance from each other in one of the main surfaces of a P⁻ substrate 1.

A load 14 such as a motor is connected to N-type island region 7a for output. A substrate diode is formed of P⁻ substrate 1 and N-type island region 7a for output. Passive N-type island region 7b becomes a portion of another control circuit formed at P⁻ substrate 1, for example, a collector of an NPN transistor.

Here, N-type island region 7a for output is formed of a buried N⁺ floating collector region 5a and of an N well 6a while passive N-type island region 7b is formed of a buried N⁺ floating collector region 5b and of an N well 6b.

In addition, isolation regions 4b and 4c that are electrically connected to P⁻ substrate 1 are formed at a region of P⁻ substrate 1 located between N-type island region 7a for output and passive N-type island region 7b.

Furthermore, a similar isolation region 4a is formed at a region of P⁻ substrate 1 on the side of N-type island region 7a for output opposite to the side on which passive N-type island region 7b is located. This isolation region 4a forms a peripheral anode. Isolation regions 4a, 4b and 4c are respectively formed of P⁺ regions 2a to 2c and P wells 3a to 3c.

On the other hand, a P substrate anode 15 is formed on the other main surface of P⁻ substrate 1. A load current (main current) flows through isolation region (peripheral anode) 4a and P substrate anode 15 at the time of freewheel operation.

N⁻ epitaxial regions 8 of which the impurity concentration is comparatively low are formed at a region located between N-type island region 7a for output and isolation region 4c, in a region located between passive N-type island region 7b and isolation region 4b, and the like, in order to attain a necessary withstand voltage.

A dummy N-type island region 7c is formed at a region located between two isolation regions 4b and 4c. Dummy N-type island region 7c is formed of a buried N+floating collector region 5c and an N well 6c. A P-type region 9 is formed at the surface of this N well 6c.

N⁺⁺ type regions 10a and 10b, which make up a pair, are formed with an interval separating them at the surface of P-type region 9. A gate electrode 11 is formed on a portion of P-type region 9 located between these N⁺⁺ type regions 10a and 10b. Thereby, a MOSFET (Metal Oxide Semiconductor Field Effect Transistor) element including P-type region 9, N⁺⁺ type regions 10a and 10b as well as gate electrode 11 is formed.

N⁺⁺ type region 10b is connected to ground (ground voltage). N⁺⁺ type region 10a is electrically connected to isolation region 4b via an aluminum wire 12. In addition, P-type region 9 is electrically connected, as a back gate 13, to isolation region 4b via aluminum wire 12.

Here, P-type region 9 is electrically connected, as back gate 13, not to the ground side but to isolation region 4b because aluminum wire 12 becomes of a negative voltage of approximately several V when the voltage of N-type island region 7a for output is in the negative condition and, therefore, it is necessary to secure the withstand voltage of the MOSFET element.

On the other hand, the MOSFET element becomes of the ON condition, as described below, in which condition the voltage of N-type island region 7a for output is positive, and, therefore, the problem concerning the withstand voltage does not occur because the voltage becomes sufficiently lower than the forward voltage drop of the diode between the drain (N⁺⁺ type region 10b) and the back gate (P-type region 9).

In addition, the MOSFET element is provided in dummy N-type island region 7c because a connection with aluminum wire 12 can be easily made and because dummy N-type island region 7c is arranged so as to surround the region wherein an output element is formed so that the length of dummy N-type island region 7c becomes large and the channel width of the MOSFET element can be increased together with this so that, thereby, current carrying ability can be easily secured.

Figure 2:
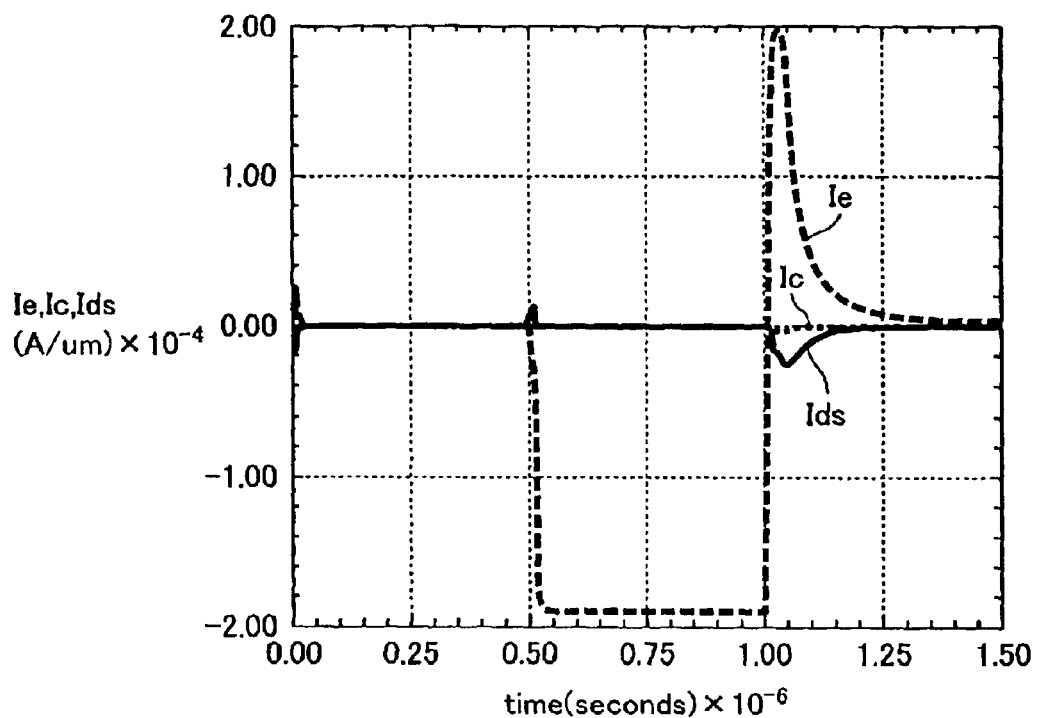
FIG. 2 is a graph showing the waveforms of respective currents according to a device simulation in the above embodiment.
Figure 3:
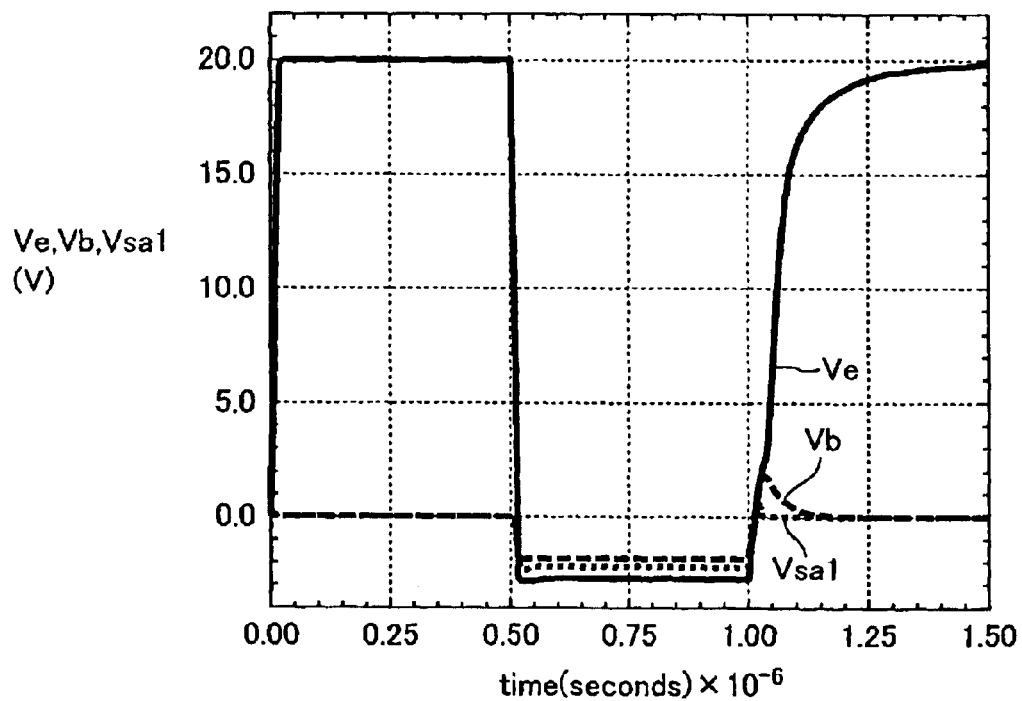
FIG. 3 is a graph showing the waveforms of respective voltages according to a device simulation in the above embodiment.

Next, the results of device simulations carried out on the structure of the above described semiconductor device are shown in FIGS. 2 and 3, respectively. FIG. 2 shows the waveform of current Ie that flows through N-type island region 7a for output, the waveform of current Ic that flows through passive N-type island region 7b and current Ids that flows through the drain region (N⁺⁺ region 10b) of the MOSFET element, respectively, in the case that voltage Ve of N-type island region 7a for output is switched to positive, to negative and to positive, in sequence, over time as shown in FIG. 3.

FIG. 3 shows the waveform of voltage Ve that is applied to N-type island region 7a for output, the waveform of voltage Vsal of aluminum wire 12 and the waveform of voltage Vb of the peripheral anode (isolation region 4a), respectively.

Figure 4:
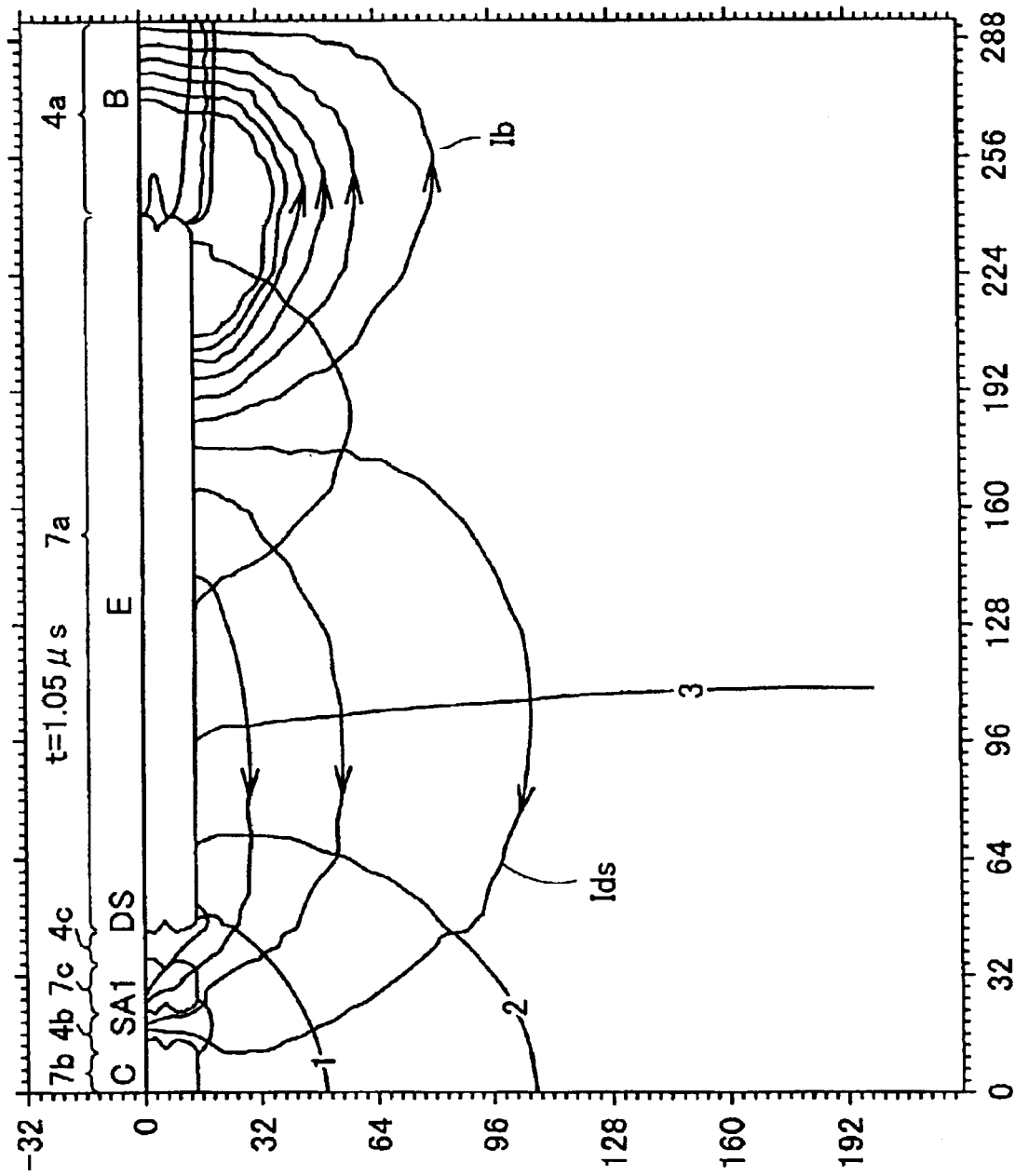
FIG. 4 is a diagram showing current and potential according to a device simulation in the above embodiment.
Figure 5:
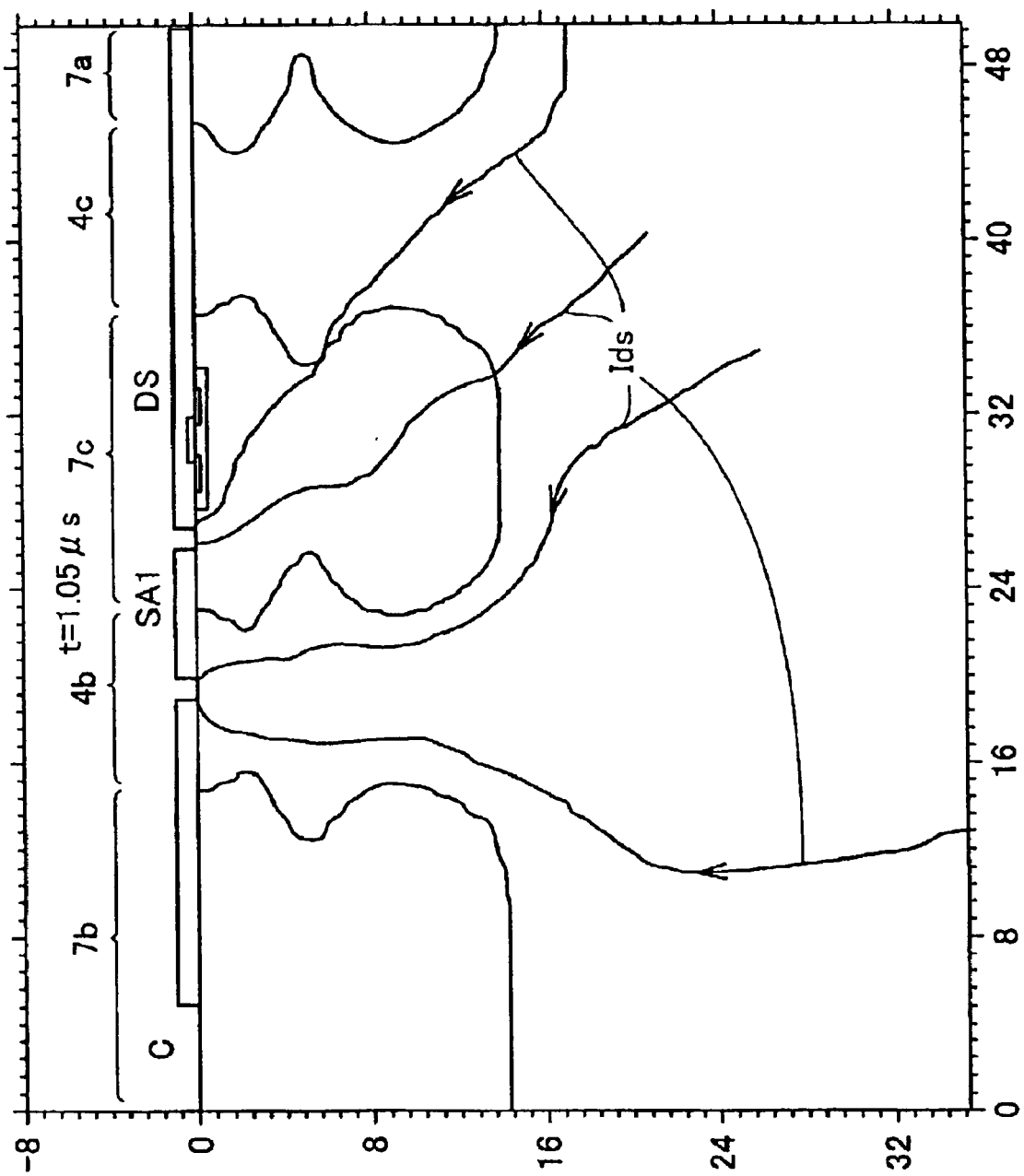
FIG. 5 is a diagram of an enlarged portion of the current and the potential shown in FIG. 4 in the above embodiment.

Furthermore, the results of the device simulation of the voltage (potential) and the current distribution within the semiconductor device at time 1.05 μs are shown in FIGS. 4 and 5, respectively.

Here, in these device simulations, the same voltage as the voltage of N-type island region 7a for output is applied to gate electrode 11 in order to convert the MOSFET element to the ON operation and, thereby, the calculations are performed.

The voltage of P⁻ substrate 1 transitionally rises so that the junction between passive N-type island region 7b and P⁻ substrate 1 becomes of a forward bias condition immediately after the voltage of N-type island region 7a for output is switched from the negative condition to the positive condition at a time after 1.0 µs has elapsed and, then, electrons shift toward N-type island region 7a for output before electrons stored in a region of P⁻ substrate 1 in the vicinity of passive N-type island region 7b are swept out so as to be eliminated.

At this time, in this semiconductor device a voltage of a predetermined threshold voltage, or higher, is applied to gate electrode 11 of the MOSFET element so that the MOSFET element is converted to the ON condition when the voltage of N-type island region 7a for output is in the positive condition.

Thereby, current Ids is bypassed to ground from N-type island region 7a for output through P⁻ substrate 1, isolation region 4b, aluminum wire 12 and the drain region (N⁺⁺ region 10b) of the MOSFET element.

That is to say, in this semiconductor device, a major portion of current Ic, which flows from N-type island region 107a for output toward passive N-type island region 107b in the conventional semiconductor device, is bypassed to ground as current Ids that flows through the drain region (N⁺⁺ region 10b) of the MOSFET element.

As a result, it is seen that current Ic that flows from N-type island region 7a for output toward passive N-type island region 7b is greatly reduced to approximately ⅛ of current Ic in the conventional semiconductor device.

Figure 12:
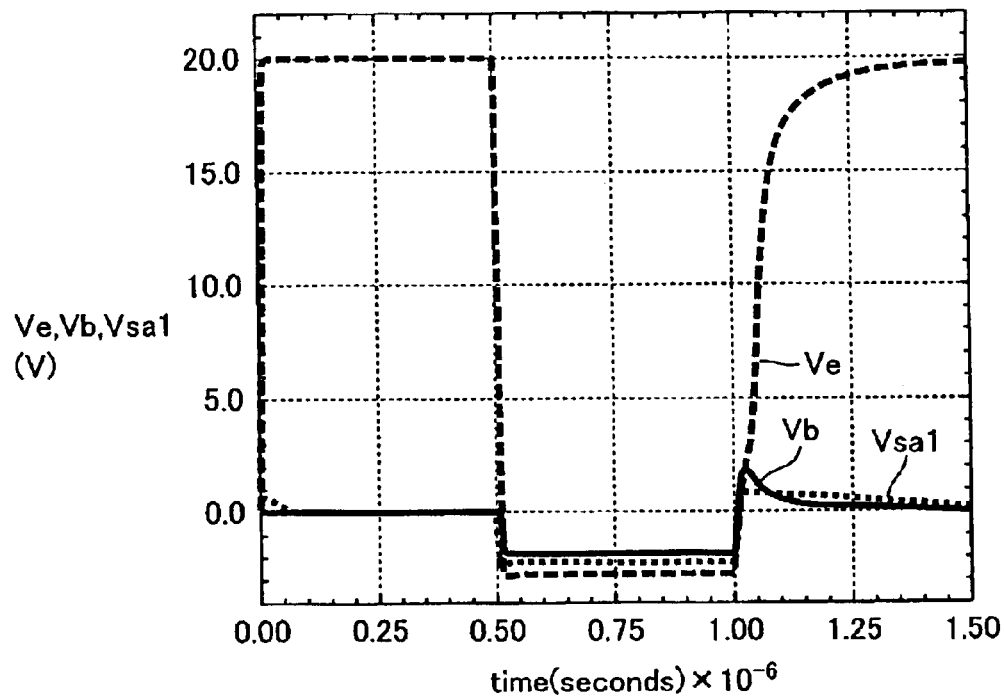
FIG. 12 is a graph showing the waveforms of respective voltages according to a device simulation in the semiconductor device of the prior art.
Figure 13:
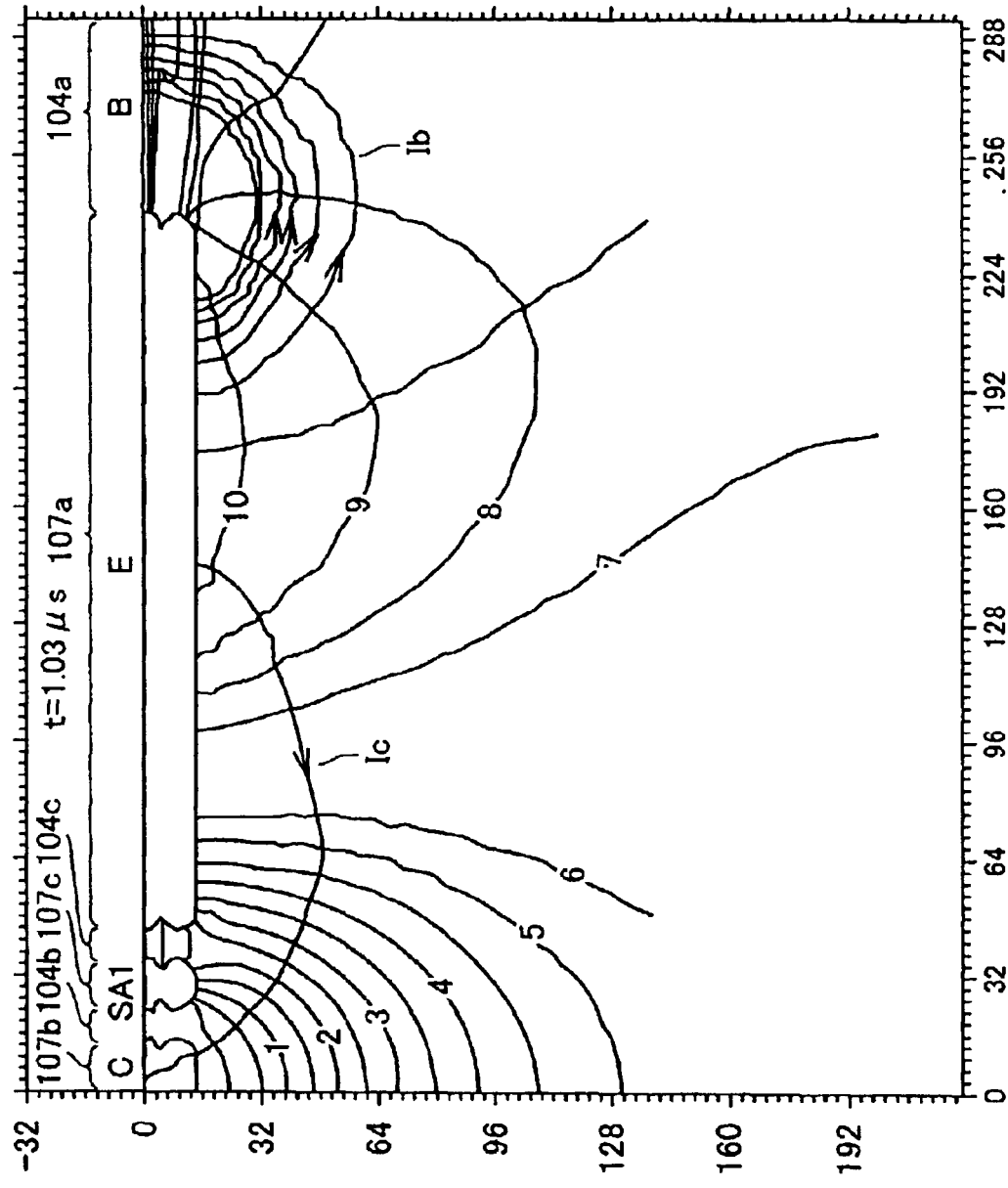
FIG. 13 is a first diagram showing current and potential according to a device simulation in the semiconductor device of the prior art.
Figure 14:
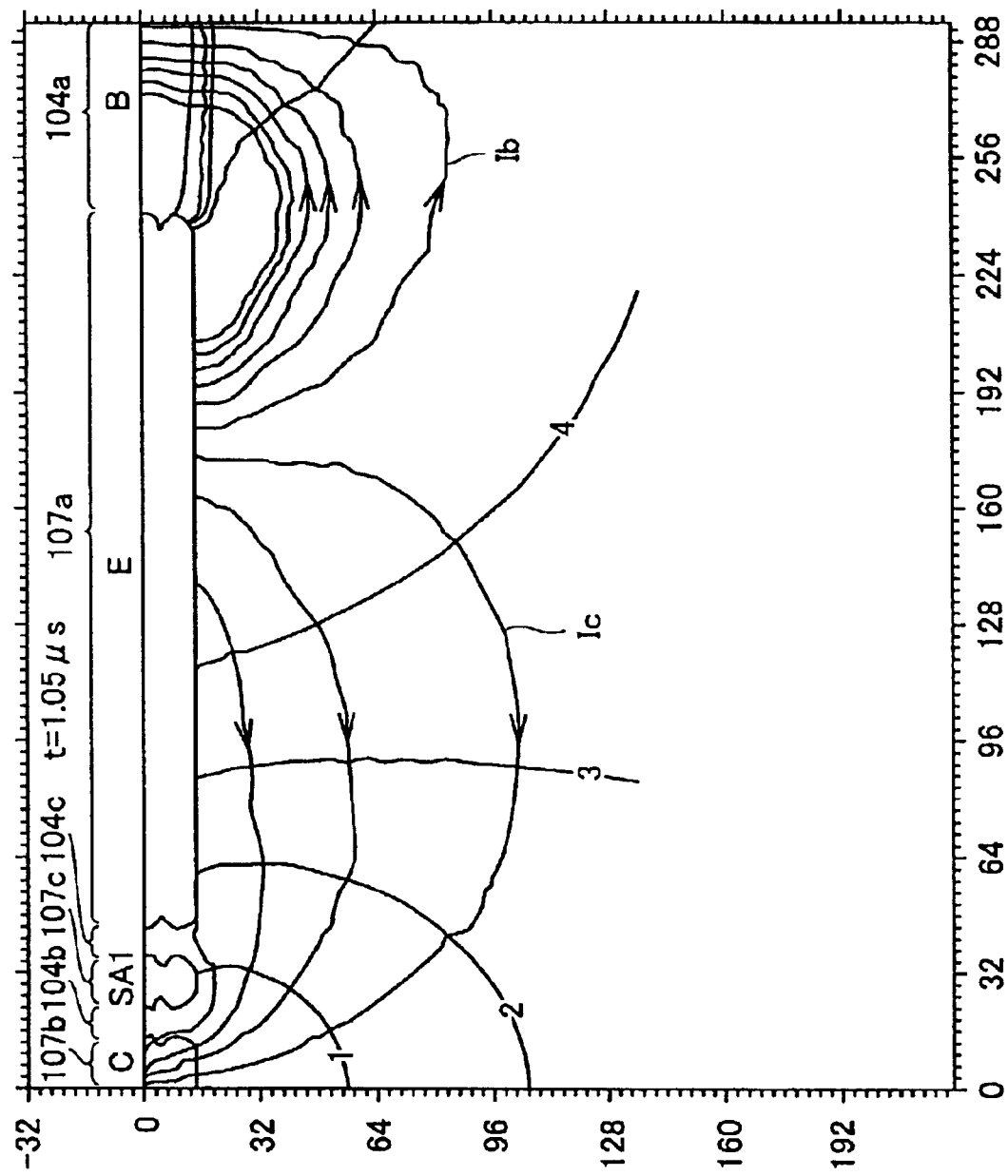
FIG. 14 is a second diagram showing current and potential according to a device simulation in the semiconductor device of the prior art.
Figure 15:
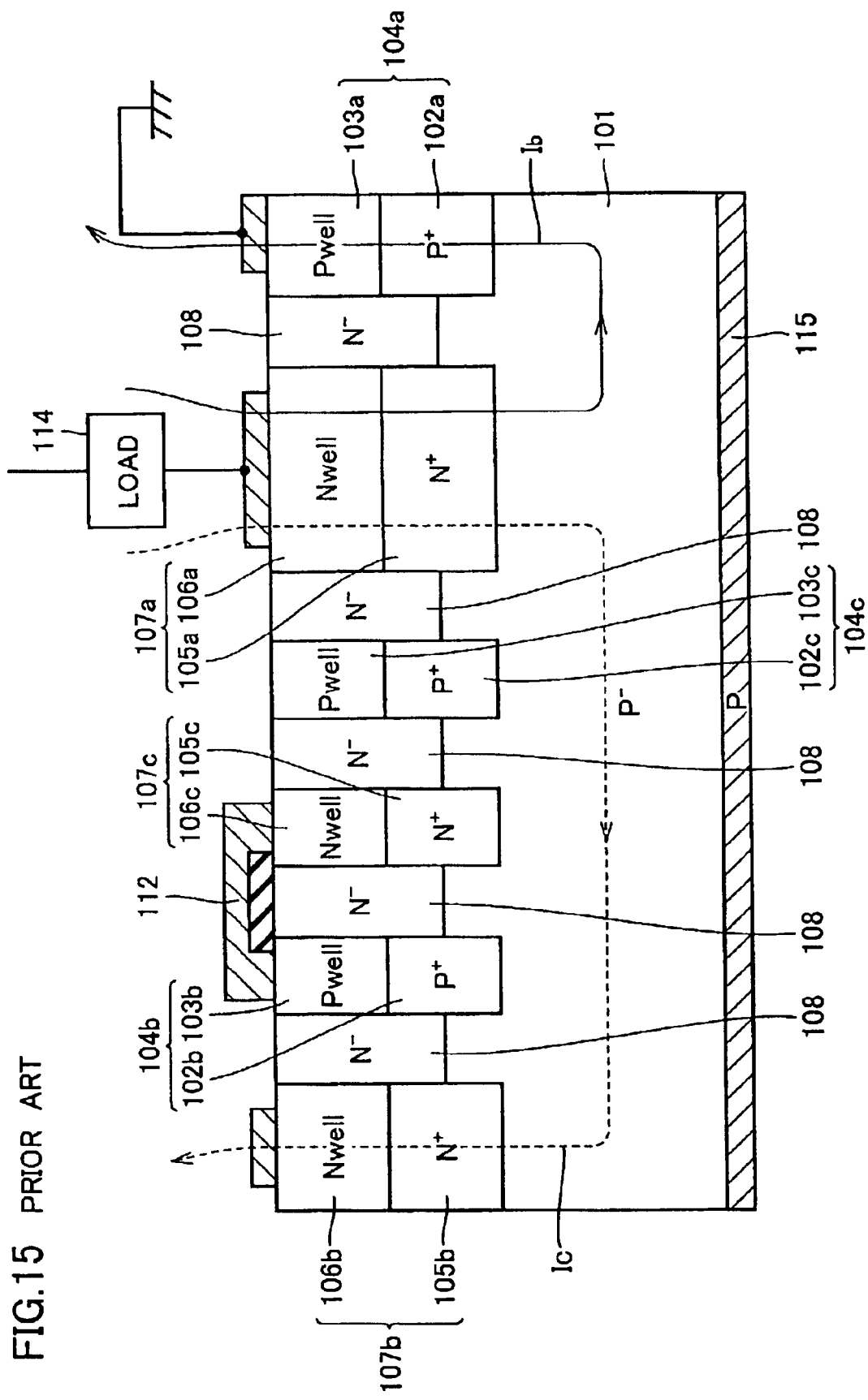
FIG. 15 is a cross sectional view for describing the operation of the semiconductor device of the prior art.
Figure 16:
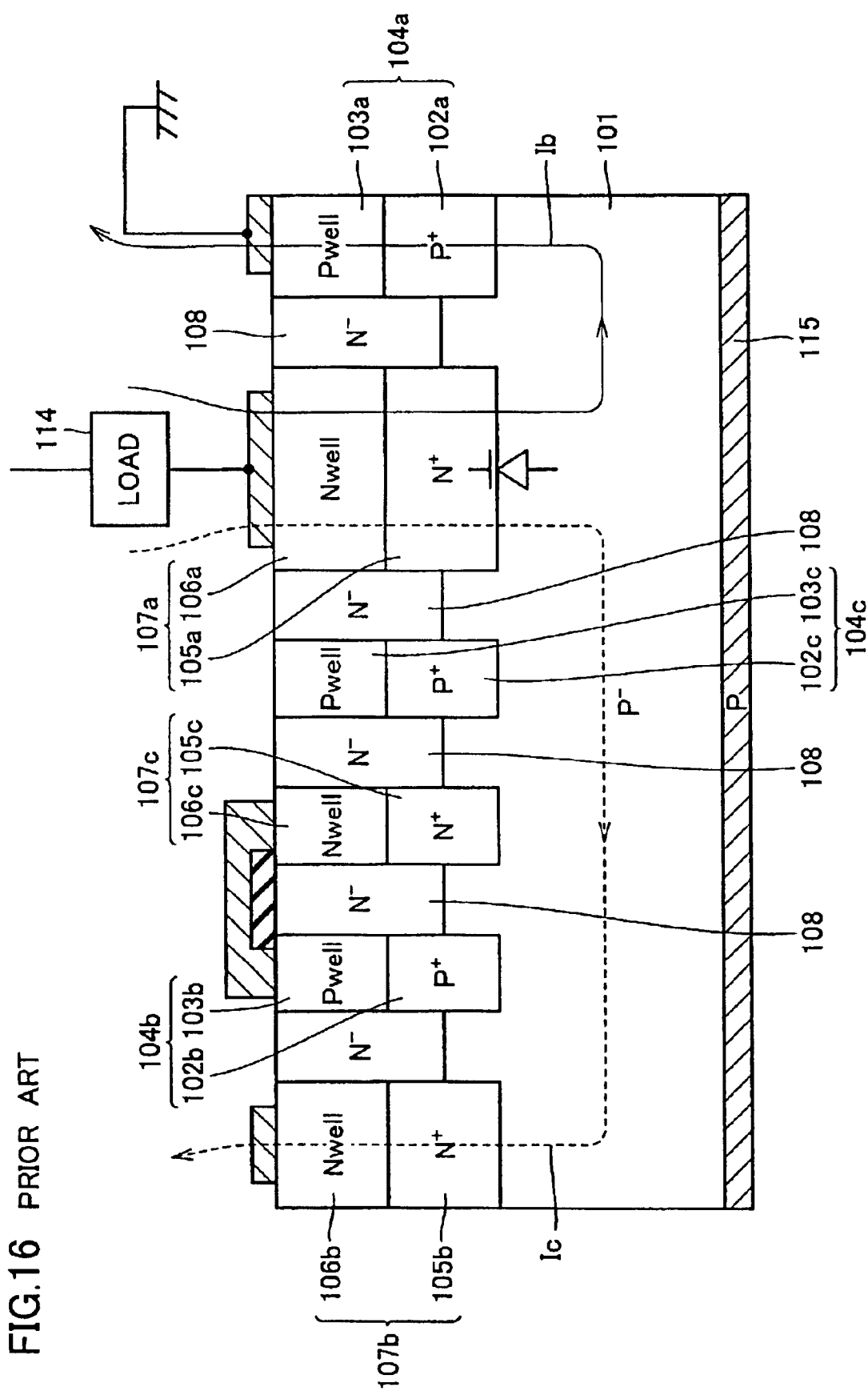
FIG. 16 is a cross sectional view for describing a problem of the semiconductor device of the prior art.
Figure 17:
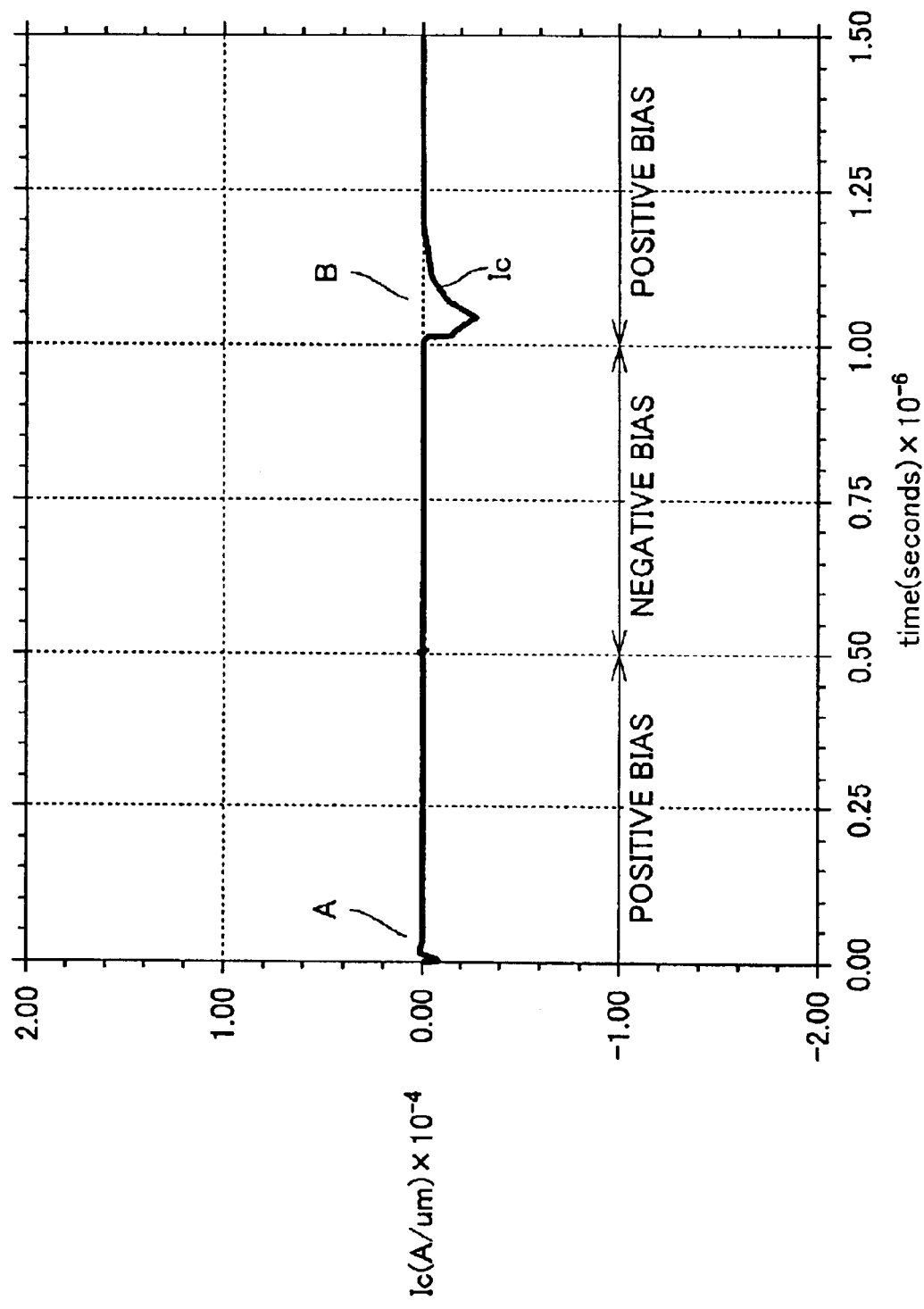
FIG. 17 is a graph showing current Ic for describing the problem of the semiconductor device of the prior art.

In addition, when the waveform of voltage Vsal of aluminum wire 12 in this semiconductor device is compared to voltage Vsal (see FIG. 12) in the conventional semiconductor device, it is seen that voltage Vsal in the reverse recovery at and after time 1 µs is restricted to very low level in this semiconductor device.

In addition, voltage Vsal during the period of time (0.5 µs to 1.0 µs) wherein the voltage of N-type island region 7a for output converts to the negative condition is approximately −2.0V and it is seen that this value is at the same level as the corresponding voltage Vsal (see FIG. 12) of the conventional semiconductor device.

Next, the results of the device simulation of voltage (potential) and current distribution within the semiconductor device at time 1.05 µs are shown in FIGS. 4 and 5. Here, FIG. 5 shows an enlarged portion in the vicinity of dummy N-type island region 7c, shown in FIG. 4. Here, the numerical values described in the equipotential lines shown in FIG. 4 represent comparative magnitudes of the voltage.

The MOSFET element becomes of the ON condition during the reverse recovery period at, and after, time 1 µs so that aluminum wire 12 and ground are electrically connected with low impedance. Therefore, the voltage of aluminum wire 12 is controlled at the comparatively low value of approximately 46 mV and a current is effectively bypassed to ground from N-type island region 7a for output through isolation region 4b and dummy N-type island region 7c before the electrons stored in P⁻ substrate 1 are swept out so as to be eliminated and, thus, it is seen that little current flows from N-type island region 7a for output to passive N-type island region 7b.

Next, in the case that the voltage of N-type island region 7a for output is switched from the 0 condition to the positive condition in the vicinity of time 0.0 µs, the voltage of P⁻ substrate 1 transitionally rises via the junction capacitance between N-type island region 7a for output and P⁻ substrate 1 due to a rapid rise in the voltage of N-type island region 7a for output.

As a result, the junction between passive N-type island region 7b and P⁻ substrate 1 tends to become of a forward bias condition.

At this time, the MOSFET element is converted to the ON condition and, thereby, current Ids is bypassed to ground from N-type island region 7a for output via P⁻ substrate 1, isolation region 4b, aluminum wire 12 and the drain region (N⁺⁺ region 10b) of the MOSFET element.

Accordingly, the MOSFET element is converted to the ON condition immediately after the voltage of N-type island region 7a for output is switched from 0 to positive in the same manner as of the case immediately after the voltage is switched from negative to positive and, thereby, current Ids is bypassed to ground from N-type island region 7a for output through P⁻ substrate 1, isolation region 4b, aluminum wire 12 and the drain region (N⁺⁺ region 10b) of the MOSFET element.

As a result, it is seen that current Ic that flows from N-type island region 7a for output toward passive N-type island region 7b is greatly reduced in comparison with current Ic in the conventional semiconductor device.

As described above, according to this semiconductor device, the MOSFET element is converted to the ON condition wherein the voltage of N-type island region 7a for output is positive. Thereby, a major portion of current Ic, which conventionally flows from N-type island region 7a for output toward passive N-type island region 7b, can be made to flow to ground as current Ids from N-type island region 7a for output through P⁻ substrate 1, isolation region 4b and the drain region (N⁺⁺ region 10b) of the MOSFET element immediately after the voltage of N-type island region 7a for output is switched from negative to positive and immediately after the voltage of N-type island region 7a for output is switched from 0 to positive.

Figure 6:
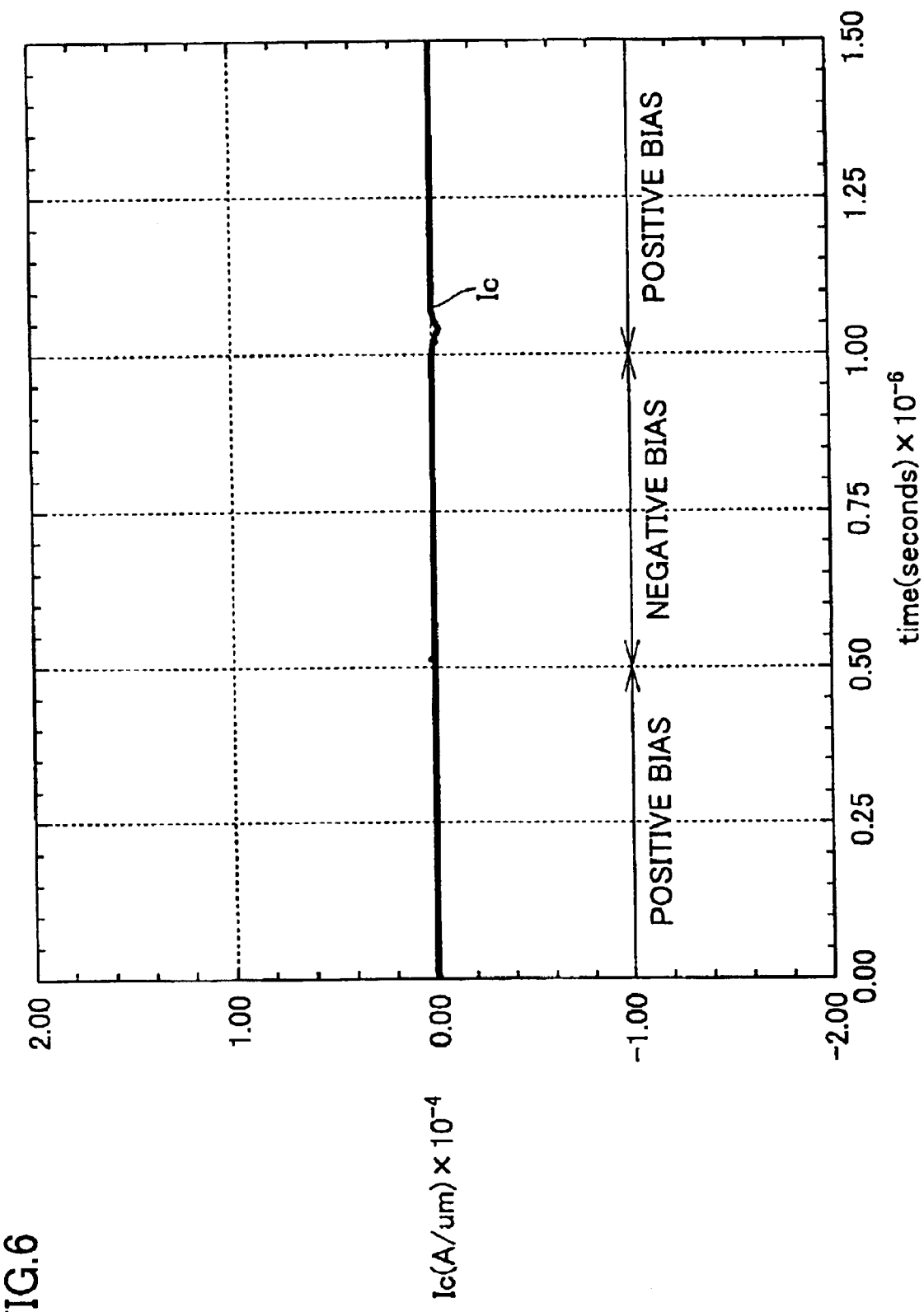
FIG. 6 is a graph showing current Ic according to a device simulation in the above embodiment.

As a result, as shown in FIG. 6, current Ic that flows from N-type island region 7a for output toward passive N-type island region 7b is greatly reduced so that malfunctions of the semiconductor device accompanying the flow of current Ic can be prevented.

Figure 7:
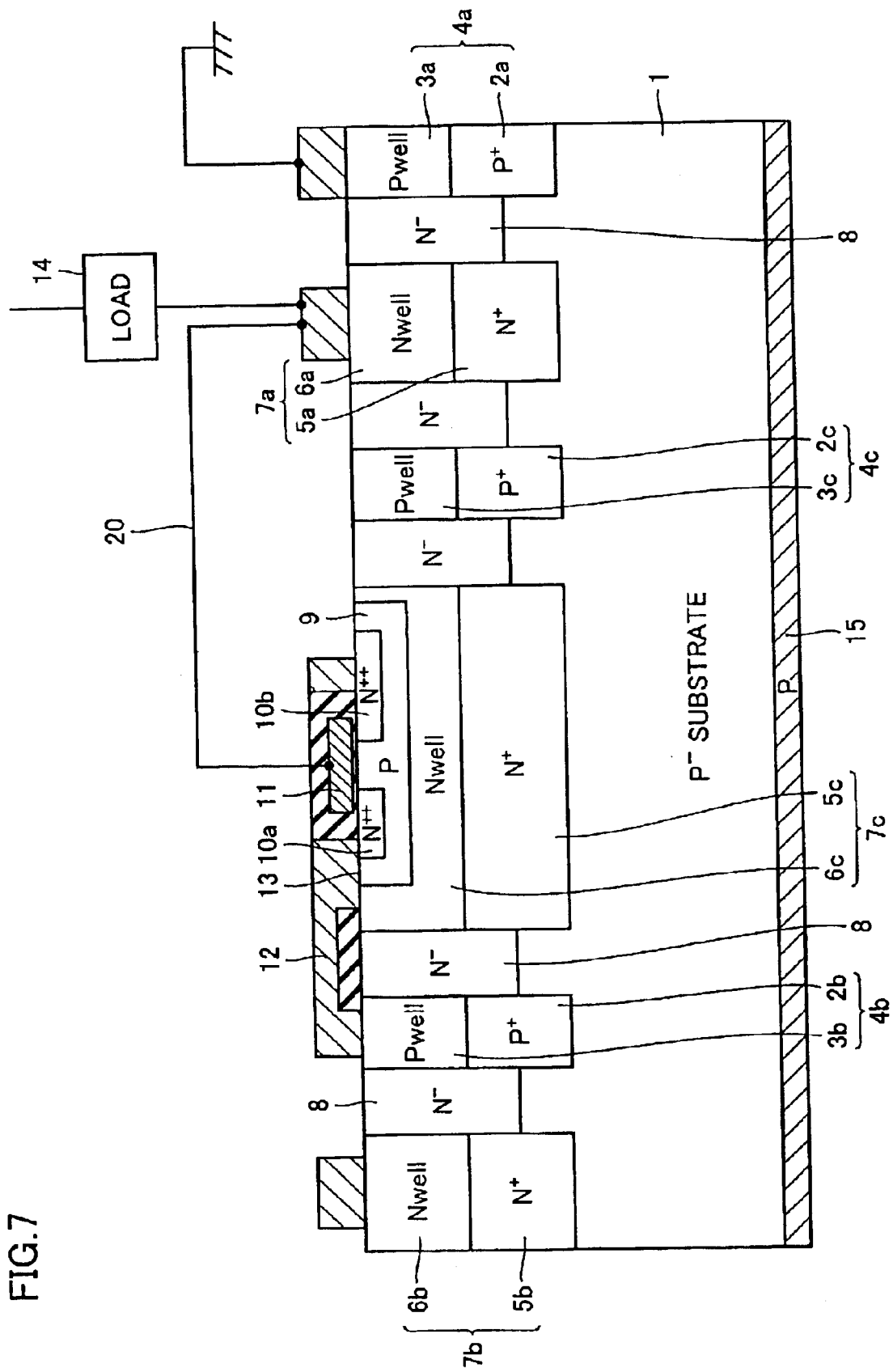
FIG. 7 is a cross sectional view showing one mode of the semiconductor device shown in FIG. 1 in the above embodiment.

In the above described device simulation, the same voltage as the voltage of N-type island region 7a for output is applied to gate electrode 11 in order to convert the MOSFET element to the ON operation so that calculations are performed as were described at the beginning of the explanation of the device simulation. That is to say, as shown in FIG. 7, a structure of a semiconductor device wherein gate electrode 11 and N-type island region 7a for output are electrically connected to each other by an appropriate wire 20 is posited.

According to this structure, the MOSFET element is converted to the ON condition wherein N-type island region 7a for output has a positive voltage so that current Ic that flows from N-type island region 7a for output toward passive N-type island region 7b is greatly reduced.

In practice, current Ic tends to flow from N-type island region 7a for output toward passive N-type island region 7b only for a short period of time (period of time T: approximately 0.25 µs, or less) after a positive voltage that has been applied to N-type island region 7a for output starts to rise.

Thus, the MOSFET element may be converted to the ON condition only during this period of time T in order to restrict current Ic. Accordingly, a signal corresponding to this period of time T may be outputted by means of a driver circuit (not shown) or a logic circuit (not shown) that controls the output element and, thereby, this signal may be applied to the gate electrode as the gate voltage.

In the region that is the object of the device simulation, aluminum wire 12, isolation region 4c and peripheral anode (isolation region 4a) are cited as places wherein voltages occur that can be applied to gate electrode 11 of the MOSFET element. Therefore, an evaluation is carried out concerning whether or not the effect of restriction of current Ic exists in the case that a voltage occurring in each region is applied to gate electrode 11.

First, in the case that the voltage of isolation region 4c is applied to gate electrode 11, though the effect of the restriction of a current can tentatively be recognized during the reverse recovery period, the peak of current Ic cannot be sufficiently restricted because the voltage quickly attenuates. In addition, in the case that the voltage of peripheral anode (isolation region 4a) is applied to gate electrode 11, the peak of current Ic at the time of reverse recovery cannot be restricted because the voltage attenuates too quickly.

Figure 8:
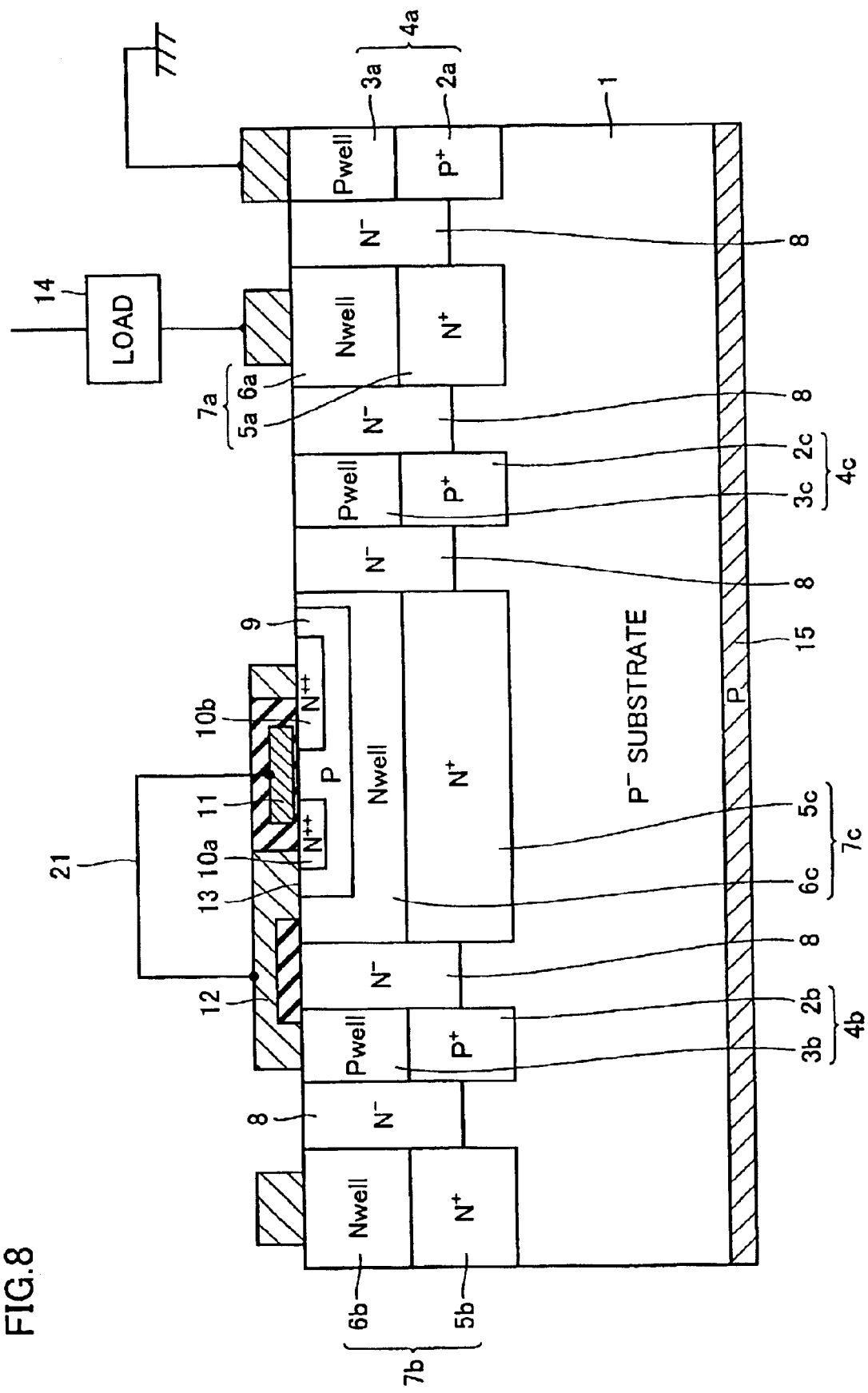
FIG. 8 is a cross sectional view showing another mode of the semiconductor device shown in FIG. 1 in the above embodiment.

In contrast to this, as shown in FIG. 8, in the case that the voltage of aluminum wire 12 is applied to gate electrode 11 via, for example, a wire 21, it is seen that the peak of current Ic is lowered, although the effect is slightly inferior to the case (see FIG. 7) wherein N-type island region 7a for output and gate electrode 11 are connected to each other.

This structure wherein the voltage of aluminum wire 12 is applied to gate electrode 11 is advantageous in the point that the voltage of aluminum wire 12 is comparatively low and the connection between aluminum wire 12 and gate electrode 11 is easy.

The voltage of aluminum wire 12 has a value of approximately 1V to 2V at the time of reverse recovery wherein the amplitude is comparatively small. Therefore, the threshold voltage of gate electrode 11 of the MOSFET element is set at a low value according to the above. In addition, the OFF condition of the MOSFET element becomes a reverse gate bias condition of approximately −2V and, therefore, it is seen that such problems as inadequate withstand voltage and a leak current between the source and the drain ($N^{++}$ regions 10a and 10b) do not occur.

In addition to this, an evaluation is carried out by means of a device simulation concerning a structure wherein another element is formed at place of the MOSFET element, which is formed at the dummy N-type island region. A structure wherein an NPN transistor is formed at the dummy N-type island region is posited as an example of such a semiconductor device. Then, in this semiconductor device, the collector and the base of the NPN transistor are short circuited so as to form a diode between the base and the emitter wherein the base is connected to the aluminum wire while the emitter is connected to ground.

A similar evaluation is carried out by means of a device simulation concerning this structure and, then, it is seen that current Ic that flows through the passive N-type island region at the time of reverse recovery is at the same level as in the case of the conventional semiconductor device so that the effect of restriction of current Ic cannot be obtained in this case.

The reason for this is considered to be because a current cannot be bypassed to ground unless the voltage of the aluminum wire exceeds the dam layer voltage of the diode formed within the dummy N-type island region and, therefore, before that occurs, current Ic flows toward the passive N-type island region.

Furthermore, in the case that the voltage of the passive N-type island region is sufficiently higher than the posited voltage of the ground, the voltage between the passive N-type island region and the P⁻ substrate is in the reverse bias condition and, therefore, current Ic is restricted from flowing toward passive N-type island region at the time of reverse recovery.

In practice, however, the voltage of the passive N-type island region varies depending on the circuit operation of the semiconductor device. Accordingly, in the device simulation in this case, an evaluation is carried out when the voltage of the passive N-type island region is posited to be the ground potential as one unfavorable condition.

Here, malfunctions of the semiconductor device can, in some cases, be prevented by the clamping effect of a diode in the case that the voltage of the P⁻ substrate is clamped by means of the diode through the aluminum wire and, in addition, in the case of a circuit having a margin that prevents a malfunction from occurring even when the voltage of the passive N-type island region rises to approximately 1 V.

Next, another semiconductor device is posited wherein, in a semiconductor device wherein an NPN transistor is formed at a dummy N-type island region, the base of the NPN transistor is not connected to the aluminum wire together with the collector but, rather, is connected to isolation region 4c via a contact.

A similar evaluation is carried out by means of a device simulation concerning this structure and, then, the voltage of the N-type island region for output stops rising at the point in time when, or immediately after, a positive voltage is applied to the N-type island region for output and, therefore, it is seen that the semiconductor device cannot, in this case, carry out normal operation.

The cause for this is considered to be because an NPN transistor is formed at the dummy N-type island region and, thereby, other parasitic operations occur among the N-type island region for output, isolation region 4c and the dummy N-type island region and, in this case, the semiconductor device is not found to have a beneficial effect. That is to say, it is seen that a sufficient effect cannot be exercised to restrict current Ic in a structure wherein an NPN transistor is formed at the dummy N-type island region.

Figure 9:
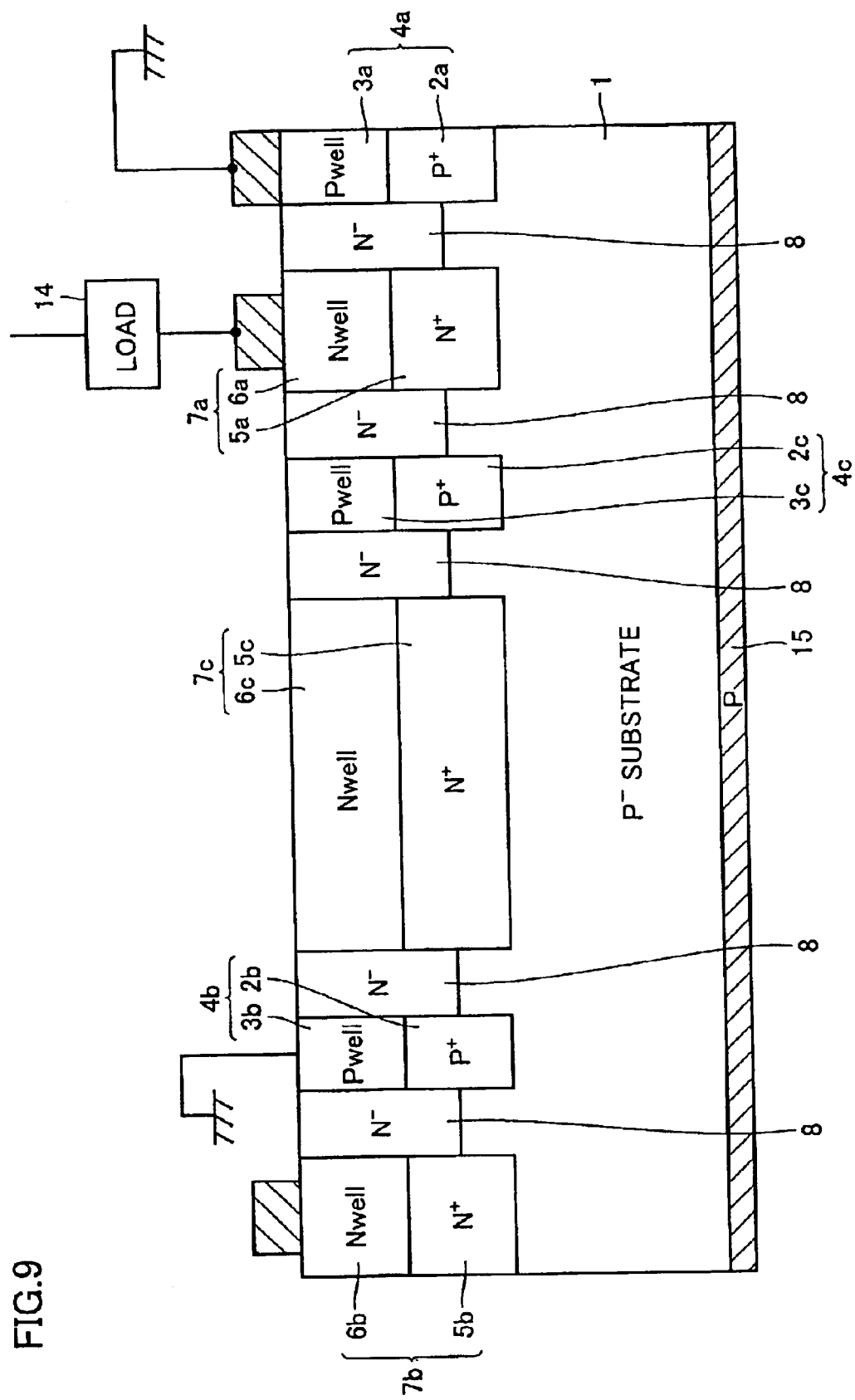
FIG. 9 is a cross sectional view of the semiconductor device for describing the effect of the semiconductor device shown in FIG. 1 in the above embodiment.
Figure 10:
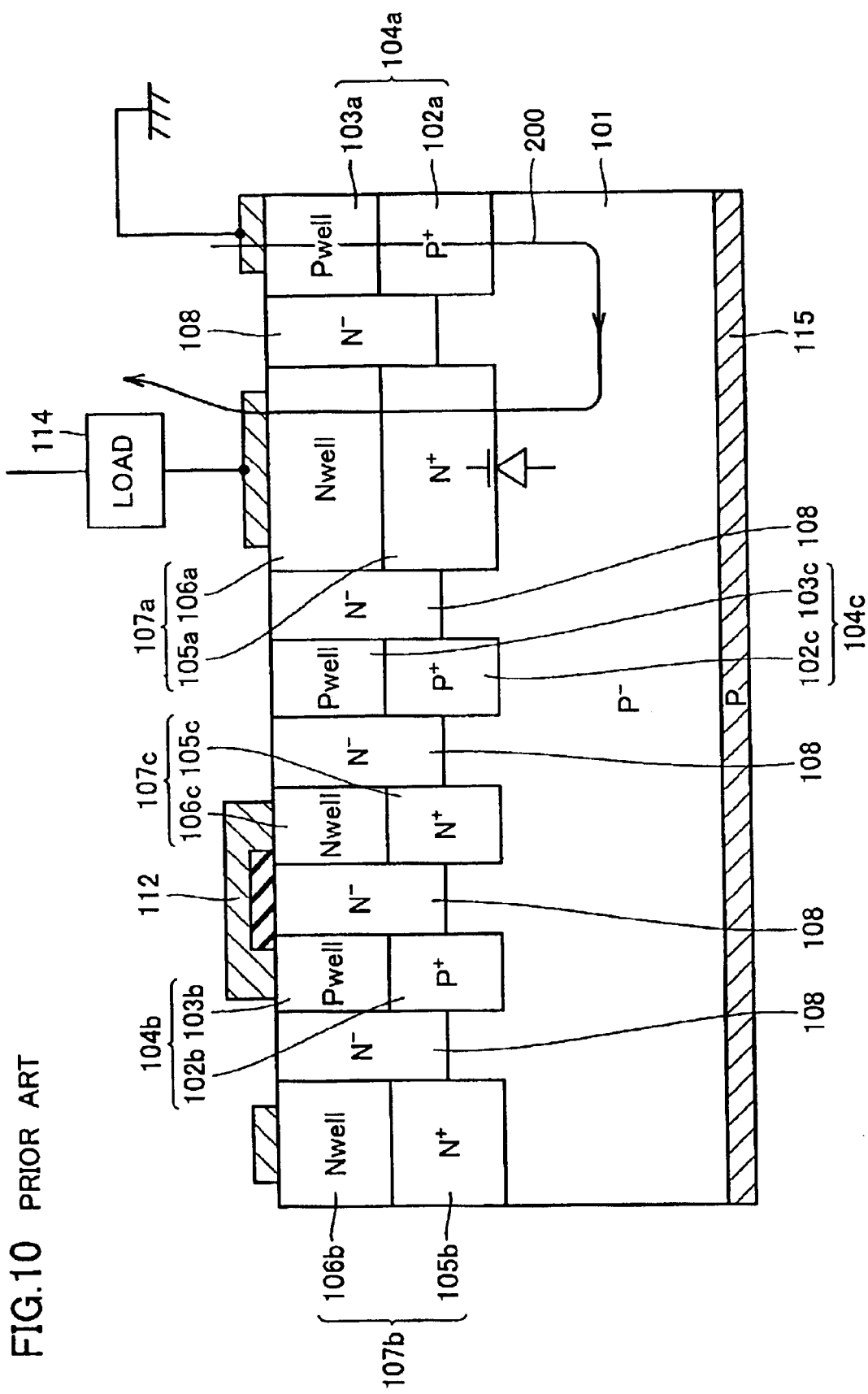
FIG. 10 is a cross sectional view of a semiconductor device according to a prior art.
Figure 11:
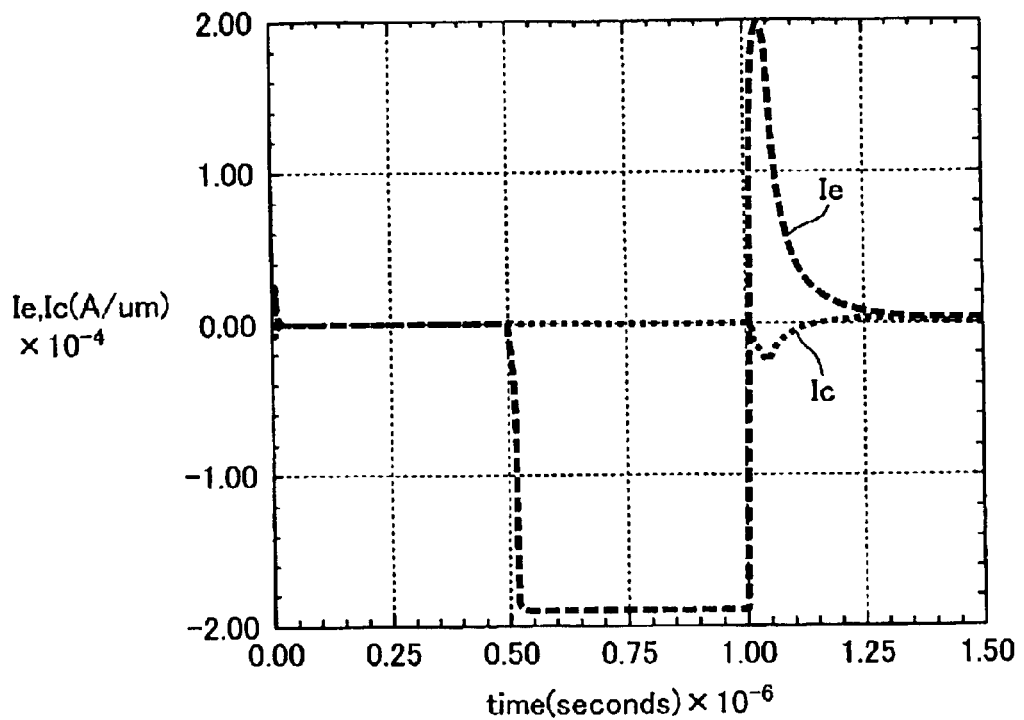
FIG. 11 is a graph showing the waveforms of respective currents according to a device simulation in the semiconductor device of the prior art.

In addition, a device simulation is attempted positing a structure wherein isolation region 4b is not connected to dummy N-type island region 7c but, rather, is directly connected to ground, as shown in FIG. 9, in order to confirm the effect of the restriction of current Ic in this semiconductor device.

In this structure, a current flows from the peripheral anode (isolation region 4a) through P⁻ substrate 1 toward N-type island region 7a for output and a current also flows from isolation region 4b through P⁻ substrate 1 toward N-type island region 7a for output in the condition wherein the voltage of N-type island region 7a for output is negative.

In this case, however, it is seen that current Ic also flows from isolation region 4b through P⁻ substrate 1 toward passive N-type island region 7b. Such a current Ic that flows toward passive N-type island region 7b invites a malfunction of the semiconductor device as described in the section concerning the prior art.

Accordingly, it is seen that, in the structure wherein isolation region 4b is directly connected to ground, though a problem does not occur in the condition wherein the voltage of N-type island region 7a for output is positive, current Ic cannot be restricted from flowing toward passive N-type island region 7b through P⁻ substrate 1 from isolation region 4b in the condition wherein the voltage of N-type island region 7a for output is negative. That is to say, it is confirmed that direct connection of isolation region 4b to ground is not favorable.

The results of the device simulation, as described above, support the conclusion that the structure wherein a MOSFET element is formed at dummy N-type island region 7c, as shown in FIGS. 1, 7 and 8, can exercise a sufficient effect of restriction of current Ic.

Thus, in a semiconductor device wherein a MOSFET element is formed at dummy N-type island region 7c, aluminum wire 12 is connected to the source ($N^{++}$ region 10a) and the drain ($N^{++}$ region 10b) is connected to ground and, thereby, the voltage to be applied to the gate electrode of the MOSFET element is controlled together with the voltage that is applied to N-type island region 7a for output.

Thereby, the MOSFET element is converted to the ON condition when the voltage of N-type island region 7a for output becomes positive so that current Ic that flows toward passive N-type island region 7b at the time of reverse recovery is greatly reduced.

In addition, in the condition wherein the voltage of N-type island region 7a for output is negative, the parasitic NPN transistor can be restricted from operating. As a result, this semiconductor device can prevent malfunctions that have occurred in the conventional semiconductor device.

Here, in the case that the lower portions of N wells 6a to 6c and P well 3a to 3c, respectively, contact $P^-$ substrate 1 in the above described semiconductor device, buried $N^+$ floating collector regions 5a to 5c and $P^+$ regions 2a to 2c can be omitted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a first impurity region of a second conductive type formed at a main surface of a semiconductor substrate of a first conductive type;
   a second impurity region of the second conductive type formed at the main surface of said semiconductor substrate at a distance from said first impurity region;
   a third impurity region of the first conductive type formed at a surface of a region of said semiconductor substrate located between said first impurity region and said second impurity region;
   a fourth impurity region of the second conductive type formed at a surface of a region of said semiconductor substrate located between said first impurity region and said third impurity region;
   a fifth impurity region of the first conductive type formed at a surface of said fourth impurity region;
   a pair of sixth impurity regions of the second conductive type formed at a distance from each other in a surface of said fifth impurity region;
   a seventh impurity region of the first conductive type formed at a surface of a region portion of said semiconductor substrate located on the side of said first impurity region opposite to the side on which said fourth impurity region is located; and
   an electrode part formed on a region portion of said fifth impurity region interposed between said pair of sixth impurity regions, wherein
   one region of said pair of sixth impurity regions and said third impurity region are electrically connected to each other, and
   the other region of said pair of sixth impurity regions is grounded,
   whereby a bypass for current is so formed as to extend from the semiconductor substrate through the third impurity region and the pair of sixth impurity regions to a around potential.

2. The semiconductor device according to claim 1, wherein
   said third impurity region and said fourth impurity region are further electrically connected to each other.

3. The semiconductor device according to claim 2, wherein
   said third impurity region and said fifth impurity region are further electrically connected to each other.

4. The semiconductor device according to claim 3, wherein
   said electrode part and said first impurity region are electrically connected to each other.

5. The semiconductor device according to claim 3, wherein
   said electrode part and said third impurity region are electrically connected to each other.

6. The semiconductor device according to claim 3, comprising
   an eighth impurity region of the first conductive type formed at a surface of a region of said semiconductor substrate located between said first impurity region and said fourth impurity region, wherein
   said electrode part and said eighth impurity region are electrically connected to each other.

7. The semiconductor device according to claim 2, wherein
   said electrode part and said first impurity region are electrically connected to each other.

8. The semiconductor device according to claim 2, wherein
   said electrode part and said third impurity region are electrically connected to each other.

9. The semiconductor device according to claim 2, comprising
   an eighth impurity region of the first conductive type formed at a surface of a region of said semiconductor substrate located between said first impurity region and said fourth impurity region, wherein
   said electrode part and said eighth impurity region are electrically connected to each other.

10. The semiconductor device according to claim 1, wherein
    said third impurity region and said fifth impurity region are further electrically connected to each other.

11. The semiconductor device according to claim 10, wherein
    said electrode part and said first impurity region are electrically connected to each other.

12. The semiconductor device according to claim 10, wherein
    said electrode part and said third impurity region are electrically connected to each other.

13. The semiconductor device according to claim 10, comprising
    an eighth impurity region of the first conductive type formed at a surface of a region of said semiconductor substrate located between said first impurity region and said fourth impurity region, wherein said electrode part and said eighth impurity region are electrically connected to each other.

14. The semiconductor device according to claim 1, wherein said electrode part and said first impurity region are electrically connected to each other.

15. The semiconductor device according to claim 1, wherein said electrode part and said third impurity region are electrically connected to each other.

16. The semiconductor device according to claim 1, comprising an eighth impurity region of the first conductive type formed at a surface of a region of said semiconductor substrate located between said first impurity region and said fourth impurity region, wherein said electrode part and said eighth impurity region are electrically connected to each other.

* * * * *